United States Patent
Han

(10) Patent No.: US 7,846,619 B2
(45) Date of Patent: Dec. 7, 2010

(54) HYBRID PHOTOMASK AND METHOD OF FABRICATING THE SAME

(75) Inventor: Dong-Hyun Han, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 432 days.

(21) Appl. No.: 11/845,711

(22) Filed: Aug. 27, 2007

(65) Prior Publication Data

US 2008/0057414 A1    Mar. 6, 2008

(30) Foreign Application Priority Data

Aug. 29, 2006   (KR) .................. 10-2006-0082470

(51) Int. Cl.
G03F 1/00 (2006.01)
G03F 1/14 (2006.01)

(52) U.S. Cl. ....................................... 430/5
(58) Field of Classification Search ............. 430/5
See application file for complete search history.

(56) References Cited

U.S. PATENT DOCUMENTS

| | | | | |
|---|---|---|---|---|
| 5,879,839 | A * | 3/1999 | Jung et al. | 430/5 |
| 6,749,970 | B2 | 6/2004 | Lukanc et al. | |
| 2005/0084769 | A1 * | 4/2005 | Pinkerton et al. | 430/5 |

FOREIGN PATENT DOCUMENTS

| | | |
|---|---|---|
| JP | 5-333534 | 12/1993 |
| JP | 7-152144 | 6/1995 |
| JP | 07-152144 | 6/1995 |
| JP | 7-219203 | 8/1995 |
| KR | 96-016315 | 12/1996 |
| KR | 2003-0009328 | 1/2003 |
| KR | 10-2004-0022089 | 3/2004 |

OTHER PUBLICATIONS

English language abstract of Korean Publication No. 2003-0009328.
English language abstract of Korean Publication No. 10-2004-0022089.

* cited by examiner

*Primary Examiner*—Mark F Huff
*Assistant Examiner*—John Ruggles
(74) *Attorney, Agent, or Firm*—F. Chau & Associates, LLC

(57) ABSTRACT

A photomask includes a first region, a second region and a third region. The first and second regions are spaced apart by the third region. A first photomask type is disposed in the first region and a second photomask type, different from the first photomask type, is disposed in the second region. A dummy photomask pattern is disposed in the third region and is structured to form a dummy wafer pattern on a wafer.

7 Claims, 7 Drawing Sheets

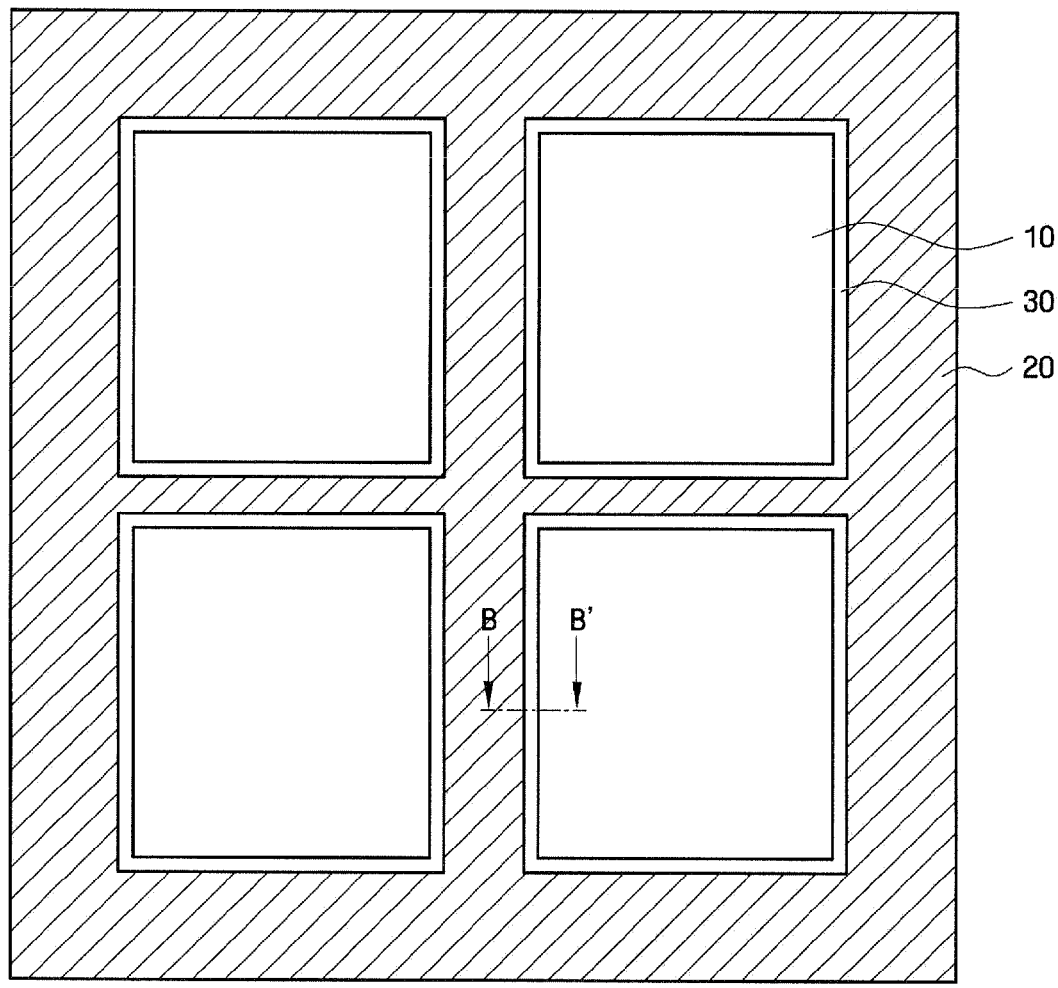
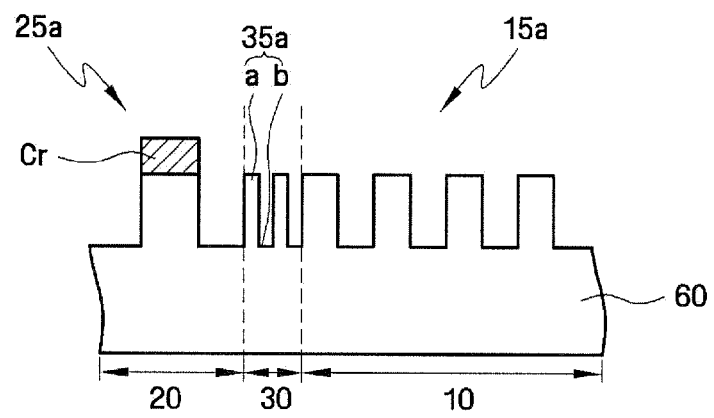

HYBRID PHOTOMASK AND METHOD OF FABRICATING THE SAME

CROSS REFERENCE TO RELATED APPLICATION

This application claims the benefit of foreign priority to Korean Patent Application No. 10-2006-0082470, filed on Aug. 29, 2006, the disclosure of which is incorporated herein by reference in its entirety.

BACKGROUND

1. Field of Invention

Embodiments of the present invention relate generally to photomasks and methods of fabricating the same. More particularly, embodiments of the present invention relate to a photomask including different type regions and methods of fabricating the same.

2. Description of the Related Art

When producing semiconductor devices, contact holes or patterns are typically formed using a photolithography process. The photolithography process generally includes a process of forming a photoresist pattern by applying a photoresist film, exposing the photoresist film and developing to form a photoresist pattern. Subsequently, an underlying structure is formed into a desired pattern through an etching process using the photoresist pattern as an etch mask.

The photoresist film is conventionally exposed to light using a photomask having an opaque pattern formed on a light-transmitting substrate such as quartz. However, a conventional photomask (e.g., binary photomask or non-phase-shift photomask) has a relatively poor resolution and, therefore, has limited use in producing highly integrated semiconductor devices.

Accordingly, phase-shift photomask (PSM) having excellent resolution has been developed. In a phase-shift photomask, a phase difference of adjacent patterns may be set to 180° when light is transmitted so as to improve the resolution as compared to the non-phase shift photomask. The phase-shift photomask is used in regions having a fine line width such as a cell region. Hence, a hybrid photomask including the non-phase-shift photomask to form peripheral circuit patterns having relatively large patterns and the phase-shift photomask to form the cell patterns having relatively small patterns has been proposed.

Wafer patterns are generally not formed at an interface between the cell and peripheral circuit regions. However, the hybrid photomask has a phase difference of light at the interface region between the phase-shift photomask type region and the non-phase-shift photomask type region is 180°. Thus, a thin (e.g., narrow), stripe-shaped line pattern may be undesirably formed at the interface region due to an offset interference of light. Peeling may occur due to the undesired line pattern wherein a portion of a desired pattern (e.g., in the cell or peripheral regions) is peeled during subsequent processes. Accordingly, the undesired line pattern may act as a defect source to cause electric short-circuits in the wafer.

SUMMARY

One embodiment of the present invention can be characterized as a hybrid photomask capable of producing structures which do not easily peel. Another embodiment of the present invention can be characterized as a method of producing such a hybrid photomask. Advantages obtained through embodiments of the present invention are not limited to those mentioned above, and other advantages obtained through embodiments of the present invention will be apparently understood by those skilled in the art through the following description.

One embodiment exemplarily described herein can be characterized as a hybrid photomask that includes a first region, a second region and a third region. The first region and the second region may be spaced apart by the third region. A first photomask type may be located in the first region and a second photomask type, different from the first photomask type, may be located in the second region. A dummy photomask pattern may be located in the third region. The dummy photomask pattern may be structured to form a dummy wafer pattern on a wafer.

Another embodiment exemplarily described herein can be characterized as a method of fabricating a hybrid photomask that includes providing a substrate including a first region, a second region and a third region, wherein the first region and the second region are spaced apart by the third region. A blocking film may be formed on the substrate in the first region, the second region and the third region. The blocking film may be patterned to form a blocking film pattern over the first region, the second region and the third region of the substrate. The substrate may be patterned using the blocking film pattern as an etch mask. Portions of the patterned blocking film may be removed from the first region and the third region to form a first photomask type in the first region, a second photomask type in the second region and a dummy photomask pattern in the third region.

BRIEF DESCRIPTION OF THE DRAWINGS

The above and other features and advantages of the present invention will become more apparent by describing in detail preferred embodiments thereof with reference to the attached drawings in which:

FIG. 1A illustrates a plan view of a hybrid photomask according to one embodiment;

FIG. 1B illustrates a sectional view of the hybrid photomask taken along line B-B' as shown in FIG. 1A;

DETAILED DESCRIPTION

Figure 1C:
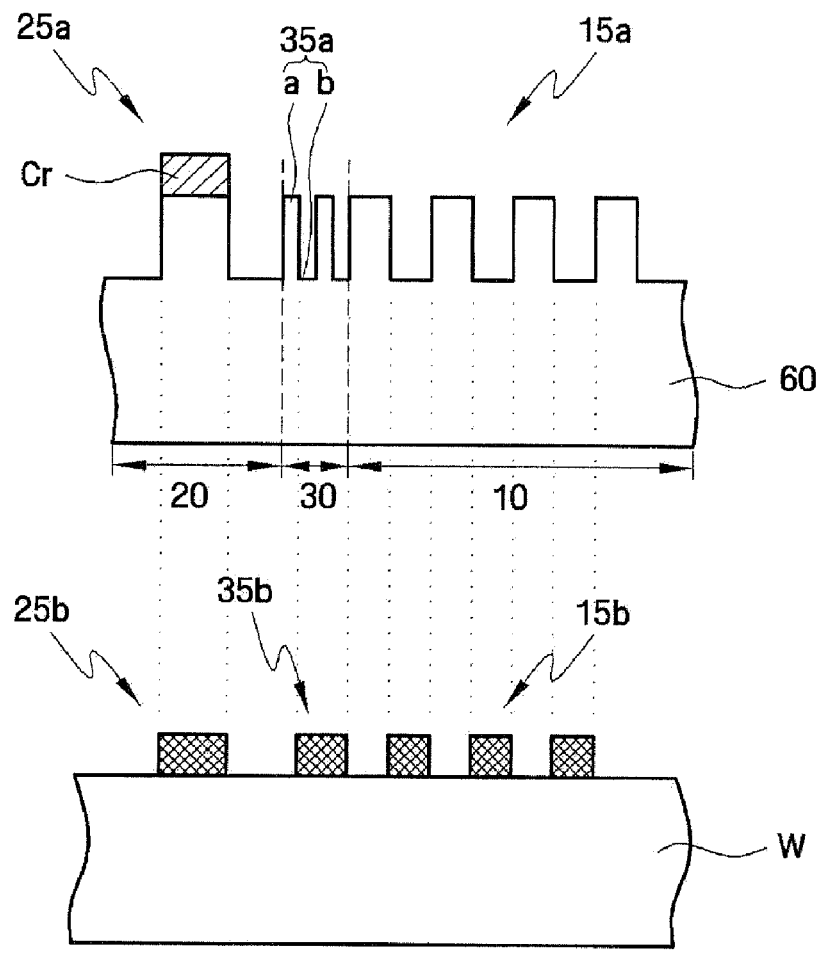
FIG. 1C illustrates a sectional view of a wafer formed patterns using the hybrid photomask as shown in FIG. 1B.

Embodiments of the present invention may be understood readily with reference to the following detailed description and the accompanying drawings. These embodiments may, however, be realized in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. It will be further understood that the terms "comprises" and/or "comprising," when used in this specification, specify the presence of stated features, steps, operations, and/or components, but do not preclude the presence or addition of one or more other features, integers, steps, operations, elements, components, and/or groups thereof. As used herein, the term "and/or" includes any and all combinations of one or more of the associated listed items.

FIG. 1A illustrates a plan view of a hybrid photomask according to one embodiment. FIG. 1B illustrates a sectional view of the hybrid photomask taken along line B-B' as shown in FIG. 1A. FIG. 1C illustrates sectional views of the hybrid photomask and a wafer formed patterns using the hybrid photomask.

Referring to FIG. 1A, a hybrid photomask may include a first region 10 having a first photomask type, a second region 20 having a second photomask type that is different from the first photomask type and a third region 30 formed between the first region 10 and the second region 20.

In one embodiment, the first region 10 may be substantially rectangular and the second region 20 may be surrounding the first region 10. The third region 30 may be formed along interfaces between the first region 10 and the second region 20. The first photomask type of first region 10 may selectively shift the phase of light passing through the first photomask type region and the second photomask type of second region 20 may not shift the phase of the light passing through the second photomask type region. Accordingly, the first photomask type may be a Cr-less photomask type (e.g., a phase-shift photomask type) and the second photomask type may be a Cr photomask type (e.g., a non-phase-shift photomask type or binary photomask type). It will be appreciated, however, that the first and second photomask types are not limited thereto. Examples of the phase-shift photomask may include, for example, a half-tone type phase-shift photomask on which a phase shifting substance such as half-tone material (e.g., MoSi or MoSiON, or the like) is applied. Examples of the non-phase-shift photomask may include chromium, molybdenum, aluminum, or the like or a combination thereof. According to one embodiment, the hybrid photomask includes the phase-shift photomask region and the non-phase-shift photomask region.

The first photomask type of the first region 10 will now be described in detail. The first region 10 may be a phase-shift photomask type region. In the phase-shift photomask type region, a difference in phase of transmitting light between adjacent patterns is 180°. In order to shift the phase of the transmitting light, the phase-shift photomask may have a structure including protruding portions and recessed portions similar to the protruding and recessed portions described below with respect to FIG. 1B. For example, the difference in phase of light passing through the protruding portion and the recessed portion may ideally be 180°, and offset interference of light occurs. Accordingly, because the phase of the light is offset interfered in the first photomask region 10, a predetermined wafer pattern may be finely formed on a wafer. Wafer patterns may be more finely formed by arranging and controlling the relative arrangements of the protruding portion and the recessed portion in the first region 10. Accordingly, a location of the first region 10 in the hybrid photomask may correspond to, for example, the location of a cell region of the wafer.

The second photomask type of the second region 20 will now be described in detail. The second region 20 may be a Cr photomask type. A portion where chromium is formed blocks incident light to form a pattern on the wafer. Additionally, the Cr photomask type may be useful to form relatively large wafer patterns. Accordingly, a location of the second region 20 in the hybrid photomask may correspond to, for example, a location of a peripheral circuit region of the wafer.

In one embodiment, a location of the interface between the first and second regions 10 and 20 in the hybrid photomask corresponds to a location of the interface between the cell and peripheral circuit regions of the wafer. Generally, no pattern is formed at the location of the interface between the cell and peripheral circuit regions of the wafer. However, when the phase-shift photomask type is used in the first region 10 and the non-phase-shift photomask type is used in the second region 20, a thin (e.g., narrow) stripe-shaped line pattern may be undesirably formed at the interface region between the cell and peripheral circuit regions of the wafer correspond to the first and second regions 10 and 20 of the hybrid photomask.

The undesired line pattern may cause peeling to occur during subsequent processes. Accordingly, the undesired line pattern may act as a defect source to cause electric short-circuits in the wafer.

In some embodiments, dummy patterns may be formed in the third region 30 to prevent the formation of thin (e.g., narrow) stripe-shaped line patterns. The third region 30 will now be described in detail.

In one embodiment, the dummy pattern in the third region 30 may form dummy patterns on the wafer. In another embodiment, the dummy patterns may be phase-shift photomask type shapes. As mentioned above, thin (e.g., narrow), stripe-shaped line patterns may be partially removed during subsequent processes by peeling. However, the dummy patterns may have a relatively thick (e.g., wide) shapes and a relatively large area. Accordingly, the dummy patterns are not easily removed during subsequent processes. Therefore, it is possible to prevent the peeling from occurring during the subsequent process.

Referring to FIG. 1B, the third region 30 may be formed between the first region 10 and the second region 20 of the hybrid photomask. In one embodiment, the first region 10 may include phase-shift patterns 15a. In one embodiment, the second region 20 may include non-phase-shift patterns 25a. In one embodiment, the non-phase-shift pattern 25a may be generally larger than the phase-shift patterns 15a. In one embodiment, the third region 30 includes dummy photomask patterns 35a. In one embodiment, the dummy photomask patterns 35a may include protruding portions 'a' and recessed portions 'b'. In some embodiments, the protruding portions 'a' may be line-shaped. In some embodiments, the recessed portions 'b' may be line-shaped or dot-shaped. The protruding portions 'a' and recessed portions 'b' may be spaced apart from each other, respectively. This will be described referring to the other drawings.

Referring to FIG. 1C, first wafer patterns 15b on a wafer W may be formed by the phase-shift patterns 15a and a second wafer pattern 25b on the wafer W may be formed by the non-phase-shift type pattern 25a. Furthermore, a dummy wafer pattern 35b may be formed on the wafer W by the dummy photomask patterns 35a. As shown, a location of the dummy photomask pattern 35a corresponds to a location of the dummy wafer pattern 35b.

As shown above, a relatively thick (e.g., wide) dummy wafer pattern 35b may be formed between the first wafer patterns 15b and the second wafer patterns 25b. Additionally, because intervals between the protruding portions 'a' are narrower, the dummy wafer pattern 35b may be thicker (e.g., wider). Therefore, it is possible to prevent the peeling of the pattern during subsequent processes.

Some embodiments of the dummy photomask patterns 35a will be exemplarily described with reference to FIGS. 2A to 2C.

Figure 2A:
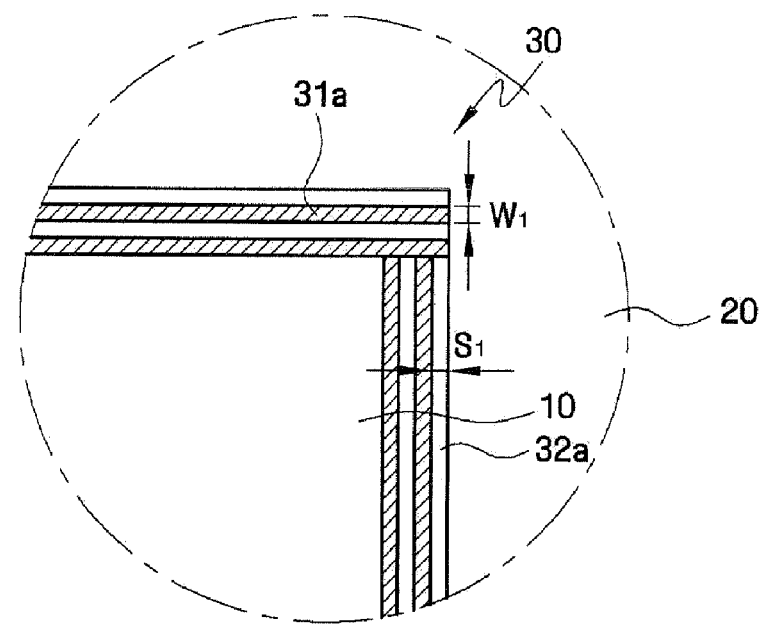
FIGS. 2A to 2C illustrate line and space patterns on the hybrid photomask according to one embodiment.
Figure 2B:
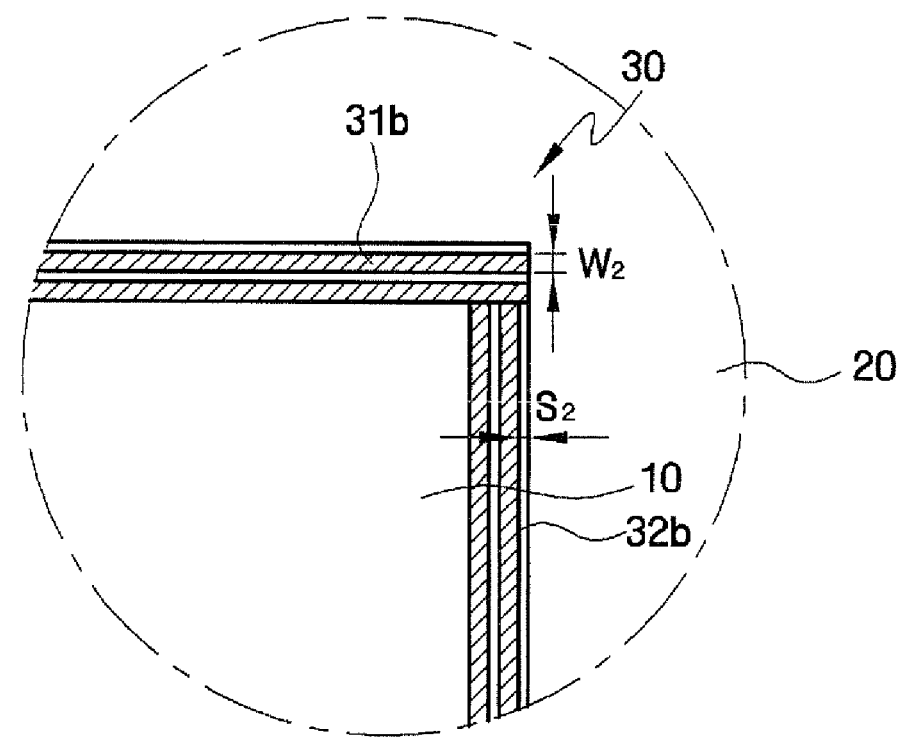
Figure 2C:
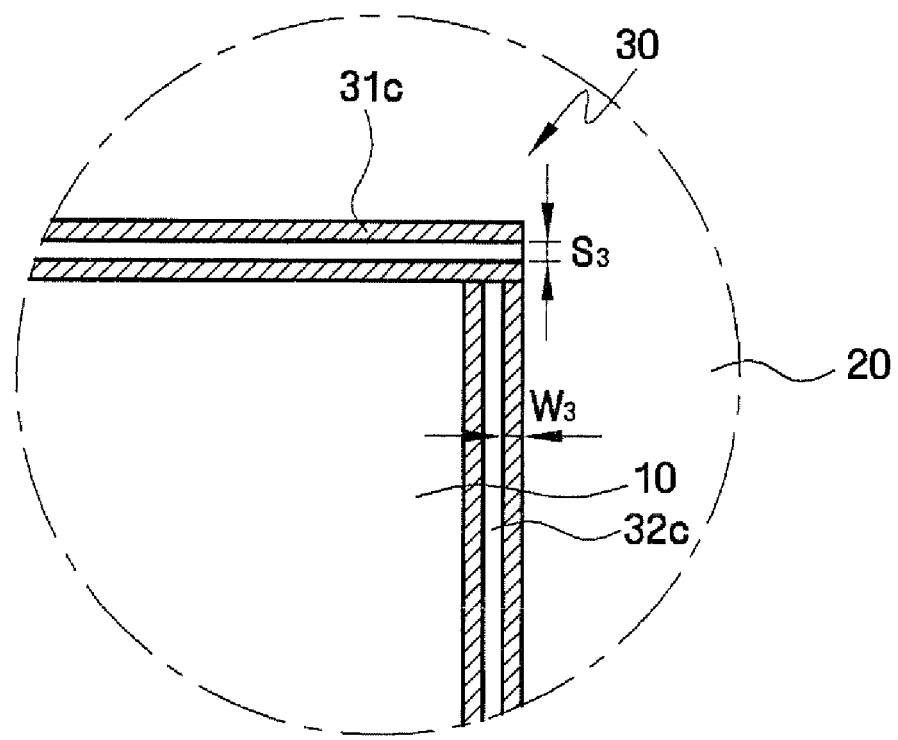

Referring generally to FIGS. 2A to 2C, protruding dummy photomask patterns 31a, 31b and 31c and recessed dummy photomask patterns 32a, 32b and 32c on the third region 30 may be provided as substantially straight lines. In some embodiments, the third region 30 may be formed along the four sides of the first region 10. Accordingly, the protruding dummy photomask patterns 31a, 31b and 31c and recessed dummy photomask patterns 32a, 32b and 32c may be formed along the four sides of the first region 10. In one embodiment, the protruding dummy photomask patterns 31a, 31b and 31c and the recessed dummy photomask patterns 32a, 32b and 32c arranged along one side of the first region 10 may be line-shaped and spaced apart from other protruding dummy photomask patterns 31a, 31b and 31c and recessed dummy photomask patterns 32a, 32b and 32c arranged along an adjacent side of the first region 10. Accordingly, the dummy wafer pattern 35b may be formed on the wafer by the first dummy photomask patterns 31a and 32a, 31b and 32b, and 31c and 32c. In addition, it is noted that FIGS. 2A to 2C illustrate wherein the first and second sides of the first region 10 are joined by a vertex.

With specific reference to the embodiment exemplarily shown in FIG. 2A, the width ($W_1$) of the first protruding dummy photomask patterns 31a and the space ($S_1$) between adjacent protruding dummy photomask patterns 31a (e.g., width of the recessed dummy photomask patterns 32a) are substantially equal. For example, the width ($W_1$) and the space ($S_1$) may be about 80 nm. However, the width ($W_1$) and the space ($S_1$) may vary depending on design rules of semiconductor devices.

With specific reference to the embodiment exemplarily shown in FIG. 2B, the width ($W_2$) of the protruding dummy photomask patterns 31b may be larger than the space ($S_2$) between adjacent protruding dummy photomask patterns 31b. For example, the width ($W_2$) of the protruding dummy photomask patterns 31b may be about 80 nm, and the space ($S_2$) between adjacent protruding dummy photomask patterns 31b (e.g., the width of the recessed dummy photomask pattern 32b) may be about 50 nm. If the width ($W_2$) and space ($S_2$) of the protruding dummy photomask patterns 31b are set so as to assure offset interference of light, it is possible to form the dummy wafer pattern 35b.

With specific reference to the embodiment exemplarily shown in FIG. 2C, the width ($W_3$) and space ($S_3$) between adjacent protruding dummy photomask patterns 31c (e.g., the space and width of the recessed dummy photomask patterns 32c) are substantially equal but the arrangement of the protruding dummy photomask patterns 31c and the recessed dummy photomask patterns 32c may be different from that exemplarily shown in FIG. 2A. More particularly, both side ends of the dummy photomask patterns 35a are protruding dummy photomask patterns 31c as shown in FIG. 2A. However, the recessed dummy photomask patterns 32c may be formed at the both side ends of the dummy photomask patterns 35a.

Some other embodiments of the dummy photomask patterns 35a will be exemplarily described with reference to FIGS. 3A to 3C.

Figure 3A:
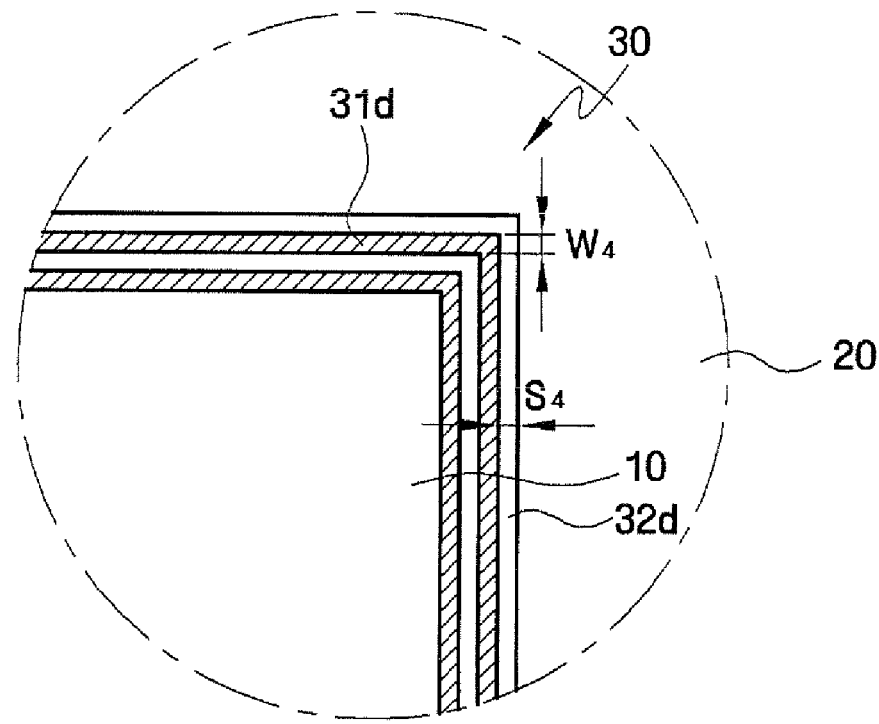
FIGS. 3A to 3C illustrate line and space patterns on the hybrid photomask according to another embodiment.
Figure 3B:
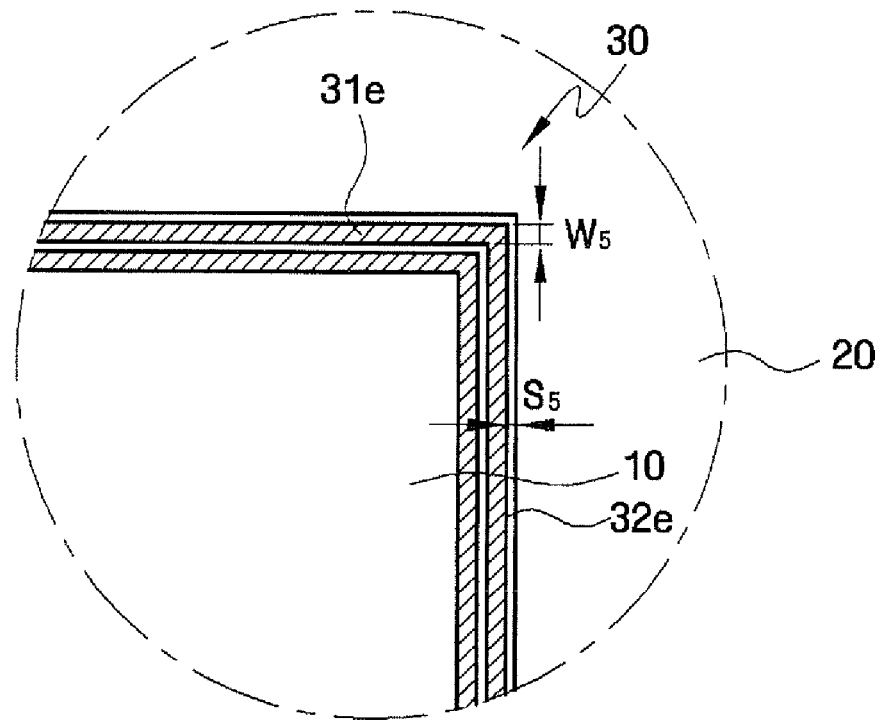
Figure 3C:
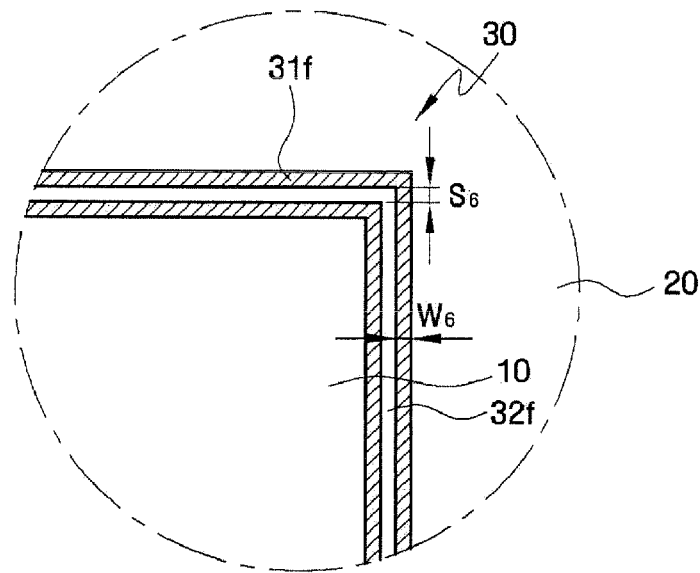

Referring to FIGS. 3A to 3C, the protruding dummy photomask patterns 31a, 31b and 31c and recessed dummy photomask patterns 32a, 32b and 32c may be formed along the four sides of the first region 10. In one embodiment, protruding dummy photomask patterns 31a, 31b and 31c and recessed dummy photomask patterns 32a, 32b and 32c arranged along one side of the first region 10 may be extended to contact the corresponding dummy photomask patterns 31a, 31b, 31c, 32a, 32b and 32c arranged along an adjacent side of the first region 10. In addition, it is noted that FIGS. 3A to 3C illustrate wherein the first and second sides of the first region 10 are joined by a vertex.

With specific reference to the embodiment exemplarily shown in FIG. 3A, and as discussed above with respect to FIG. 2A, the width ($W_4$) and space ($S_4$) between the protruding dummy patterns 31d (e.g., the space and width of the recessed dummy photomask pattern 32d) are substantially equal. Unlike the embodiment shown in FIG. 2A, however, the protruding dummy photomask patterns 31d and recessed dummy photomask patterns 32d are continuously connected along the four sides of the first region 10, respectively. Accordingly, one protruding dummy photomask patterns 31d (or recessed dummy photomask pattern 32d) can be characterized as extending continuously along the four sides of the first region 10.

With specific reference to the embodiment exemplarily shown in FIG. 3B, and as discussed above with respect to FIG. 2B, the width ($W_5$) of the protruding dummy photomask patterns 31e is larger than the space ($S_5$) between adjacent protruding dummy photomask patterns 31e (e.g., the space of the recessed dummy photomask patterns 32e may be larger than the width of the recessed dummy photomask patterns 32e). Unlike the embodiment shown in FIG. 2B, however, the protruding dummy photomask patterns 31e and the recessed dummy photomask patterns 32e are continuously connected along the four sides of the first region 10, respectively.

With specific reference to the embodiment exemplarily shown in FIG. 3C, and as similarly discussed above with respect to FIG. 2C, the arrangement of the protruding dummy photomask patterns 31f and the recessed dummy photomask patterns 32f may be different from that shown in FIG. 3A. $W_6$ represents the width of the protruding dummy photomask pattern 31f and $S_6$ represents the width of the recessed dummy photomask pattern 32f.

Figure 4:
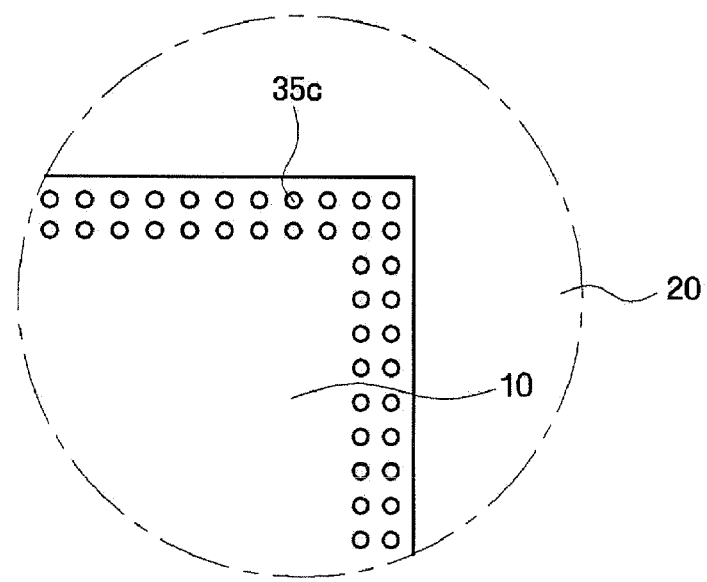
FIG. 4 illustrates a dot pattern on the hybrid photomask according to still another embodiment.

FIG. 4 illustrates dot-shaped dummy patterns 35c according to one embodiment.

Referring to FIG. 4, dot-shaped recessed dummy patterns 35c may be formed on the third region 30.

In one embodiment, the diameter of the dots of the dot-shaped dummy patterns 35c may be substantially the same as the width (W) or space (S) of the protruding dummy photomask patterns exemplarily described with respect to FIG. 2A. In another embodiment, a distance between adjacent dot patterns arranged in a row may be substantially equal to or less than the diameter of the dot 35. Accordingly, an interval between the dot patterns may be set so as to assure diffraction interference of light to form a dummy bar pattern on the wafer due to diffraction interference of light.

One embodiment of a method of forming the hybrid photomask described above will be exemplarily described with reference to FIGS. 5 to 7.

Figure 5:
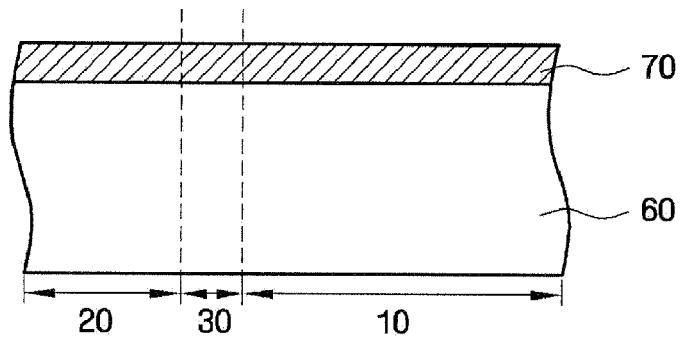
FIGS. 5 to 7 sequentially illustrate one embodiment of a method of forming the hybrid photomask.

Referring to FIG. 5, a substrate 60, formed of a material capable of transmitting light (e.g., quartz), is provided as a main body of the hybrid photomask. A blocking film 70, may be formed of an opaque material (e.g., chromium (Cr)), may be deposited on first, second and third regions 10, 20 and 30, respectively, of the substrate 60. As mentioned above, the third region 30 is between the first and second regions 10 and 20.

In one embodiment, for example, the blocking film 70 may have a thickness of about 900 to about 1100 Å. The blocking film 70 may be deposited onto the substrate 60 by a process such as physical vapor deposition. Examples of the physical vapor deposition include, but are not limited to, metal evaporation or metal vapor deposition.

Subsequently, a photoresist film (e.g., e-beam resist, not shown) may be formed on a surface of the blocking film 70. The photoresist film may then be exposed using an electron beam lithography system and developed using e-beam resist developing system to form a photoresist pattern (not shown).

Figure 6:
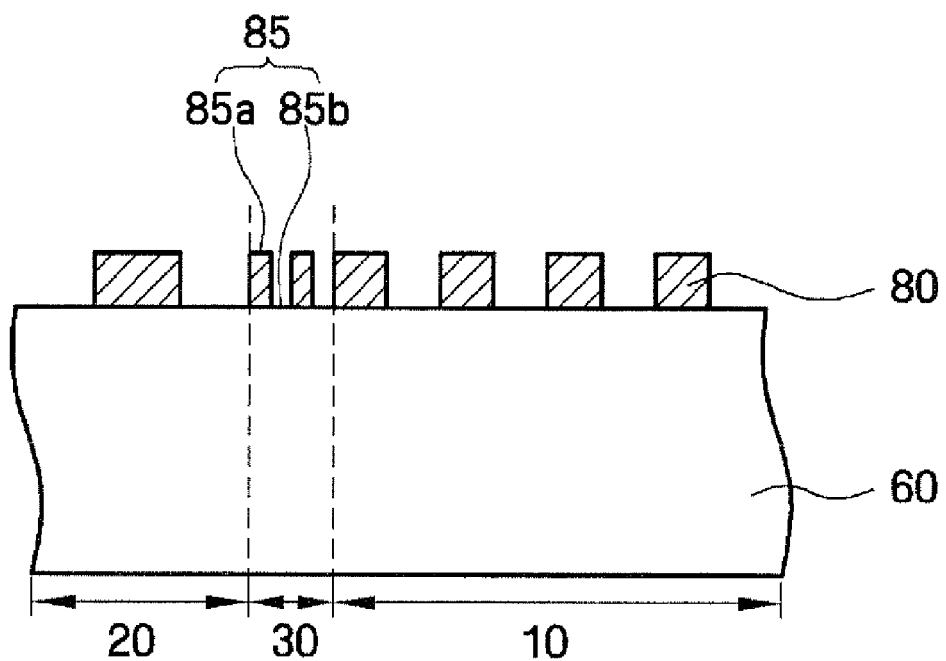

Referring to FIG. 6, the blocking film pattern 80 may be formed using the photoresist pattern as an etch mask on the first, second and third regions 10, 20 and 30, respectively. In one embodiment, a first region of the blocking film patterns 80 on the first region 10 substantially corresponds to a cell region of a wafer and a second region of the blocking film patterns 80 on the second region 20 substantially corresponds to a peripheral circuit region of the wafer. In another embodiment, the second portion of the blocking film patterns 80 on the second region forms peripheral circuit patterns in the peripheral circuit region of the wafer that may be larger than cell patterns in the cell region of the wafer. A third portion of the blocking film patterns 80 on the third region 30 is a dummy blocking film pattern 85 substantially corresponds to dummy patterns to be formed on the wafer. In the illustrated embodiment, the dummy blocking film pattern 85 includes protruding portions 85a and space 85b (e.g., a line-shaped space, a dot-shaped space, or the like).

Figure 7:
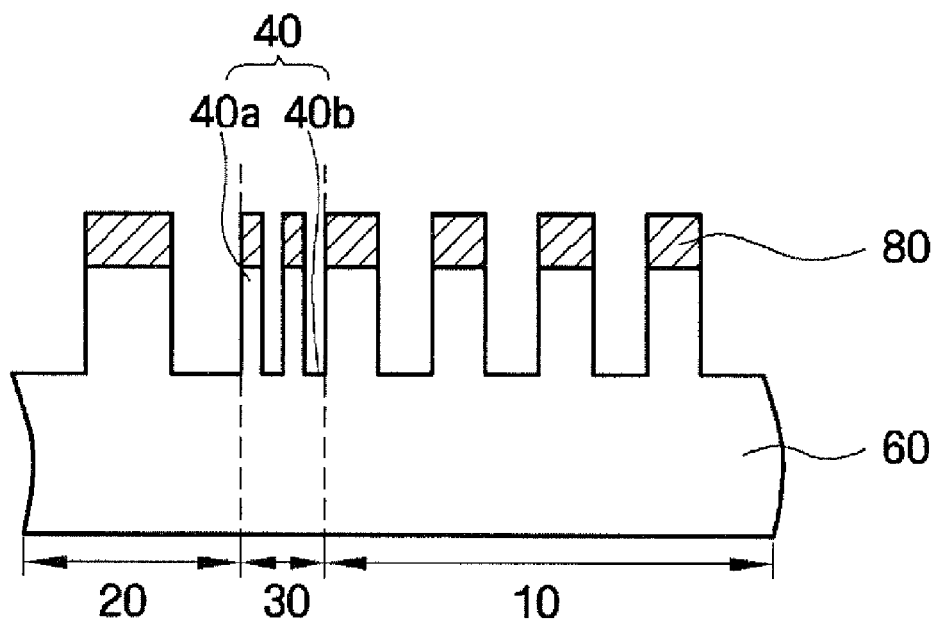

Referring to FIG. 7, the substrate 60 is patterned using the blocking film pattern 80 as an etch mask to form recessed portions of the substrate 60. In one embodiment, the depth to which the substrate 60 is recessed corresponds to the wavelength of light emitted by a light source that will be used in conjunction with the resulting photomask. In one embodiment, the substrate 60 may be recessed to a depth of about 2000 to about 2400 Å when the light source is the KrF light source. In one embodiment, the substrate 60 may be etched using plasma with CF-based reaction gases.

As a result of patterning the blocking film pattern 80, a phase-shift photomask type region may be formed on the first region 10, wherein the phase-shift photomask type region has a plurality of recesses and protrusions. Accordingly, narrow wafer patterns may be subsequently formed on the wafer according to a phase difference between the recesses and protrusions of the phase-shift photomask type region. Also as a result of patterning the block film pattern 80, dummy photomask patterns may be formed on the third region 30 of the substrate 60, wherein the dummy photomask patterns may have a plurality of recesses and protrusions arranged at a reduced interval compared to the recesses and protrusions of the phase-shift photomask type region. Accordingly, dummy wafer patterns may be formed on the wafer using offset interference generated by the dummy photomask patterns. Accordingly, in one embodiment, the width of the protruding portions 40a (e.g., the space between adjacent recessed portions 40b) may be about 80 nm and the space of the protruding portions 40a (e.g., the width between adjacent recessed portions 40b) may be about 80 nm. It will be appreciated, however, that the width of, and space between, protruding portions 40a is not necessarily limited thereto. In another embodiment, the width of the protruding portions 40a may be larger than that of the space of the protruding portions 40a. In one embodiment, the protruding portions 40a and the recessed portions 40b may be separately formed or continuously formed along the four sides of the first region 10, respectively, to achieve a dummy wafer pattern such as that shown in FIGS. 2A-3C.

Referring now to FIG. 1B, the aforementioned first and third regions of the blocking film pattern 80 are removed such that the aforementioned second region of the blocking film pattern 80 remains. Thereby, a phase-shift photomask type region may be created within the first and third regions 10 and 30 of the substrate 60 while a non-phase-shift photomask type region may be formed within the second region 20 of the substrate 60. As a result, dummy wafer patterns may be formed at the interfaces between the cell and peripheral circuit regions of the wafer. Accordingly, it is possible to prevent the occurrence of peeling during subsequent processes due to the dummy wafer patterns on the wafer, and to prevent the occurrence of defect source of electric short-circuit of the semiconductor device resulting from the peeling.

One exemplary implementation of the embodiments described above will now be described with reference to FIGS. 8A and 8B. Because other constitutions, which are not mentioned, may be easily obtained by those skilled in the art, their description will be omitted.

Figure 8A:
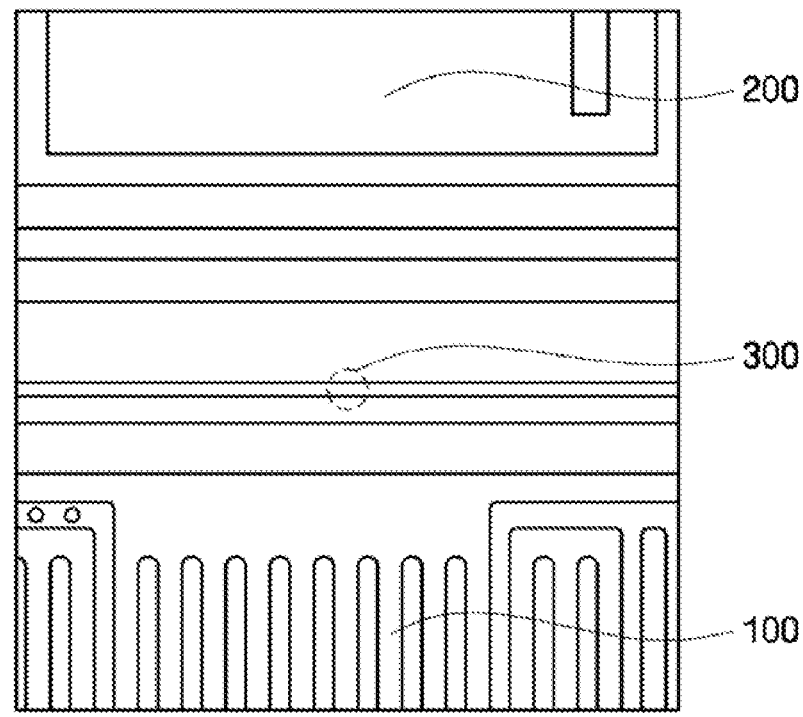
FIGS. 8A and 8B illustrate an experimental example of formed wafer patterns using the hybrid photomask.
Figure 8B:
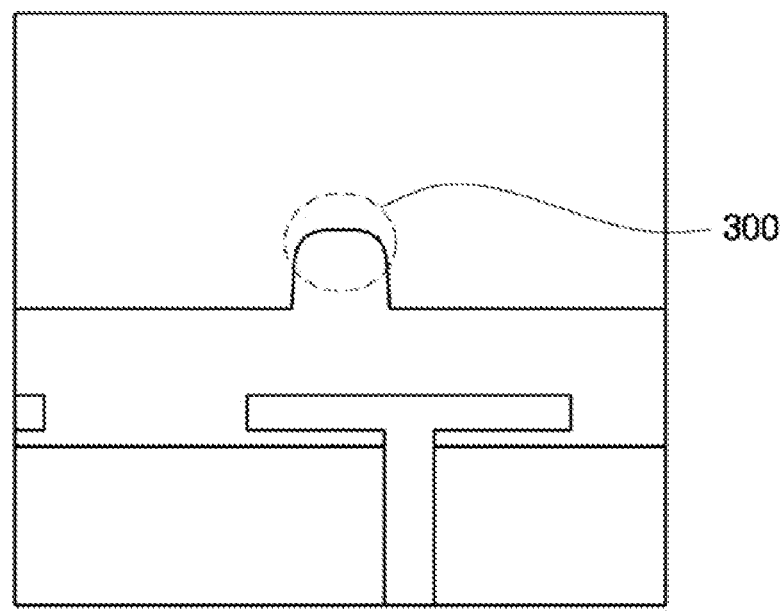

The implementation shown in FIGS. 8A and 8B is top view of the wafer having a dummy wafer pattern 300 formed using the hybrid photomask including a first region, a second region and a third region between the first and second regions. The first region substantially corresponds to the cell region 100 of the wafer. The second region substantially corresponds to the peripheral circuit region 200 of the wafer. The protruding dummy photomask pattern and recessed dummy photomask pattern were formed so as to be separated along the four sides of the cell region. As shown in FIGS. 8A and 8B, the dummy wafer pattern 300 is formed using the above-mentioned hybrid photomask.

Referring to FIG. 8A, the dummy wafer pattern 300 is formed between the cell region 100 and the peripheral circuit region 200 on the wafer. In the cell region 100, relatively finer patterns are formed, and, in the peripheral circuit region 200, relatively larger patterns are formed. The dummy pattern 300 may be formed along the side of the cell region 100.

FIG. 8B is an enlarged view of the dummy pattern 300 of FIG. 8A.

Referring to FIGS. 8A and 8B, in the embodiments of the present invention, the thick (e.g., wide) dummy pattern 300 may be formed between the cell region 100 and the peripheral circuit region 300, thereby preventing the peeling from occurring.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

As described above, a method of fabricating a hybrid photomask and a hybrid photomask fabricated using the method according to the present invention may have some or all of the following advantages. First, dummy photomask patterns are formed in a dummy region that is the interface of regions having different photomask types to form dummy patterns on wafers. Second, because the dummy patterns are formed on the wafer, it is possible to prevent the peeling from occurring. Third, because the peeling is prevented from occurring, it is possible to prevent the electric short-circuit of the wafer.

What is claimed is:

1. A photomask comprising:
   a first region, a second region and a third region, wherein the first region and the second region are spaced apart by the third region, wherein, the first region comprises a first photomask type, the second region comprises a second photomask type, the second photomask type being different from the first photomask type, and the third region comprises a dummy photomask pattern, wherein the dummy photomask pattern is structured to form a dummy wafer pattern on a wafer, wherein the dummy photomask pattern comprises a plurality of line-shaped patterns spaced apart from each other by a space pattern and at least one of the plurality of line-shaped patterns is a protruding pattern and the space pattern is a recessed pattern.

2. The photomask of claim 1, wherein the dummy photomask pattern comprises a phase-shift photomask.

3. The photomask of claim 1, wherein the first photomask type is a phase-shift photomask and the second photomask type is a non-phase-shift photomask.

4. The photomask of claim 1, wherein the first region corresponds to a cell region of the wafer and the second region corresponds to a peripheral circuit region of the wafer.

5. The photomask of claim 1, wherein the first region includes a first side, a second side and a vertex joining the first side and the second side; and the third region is located along the first and second sides.

6. The photomask of claim 5, wherein the dummy photomask pattern comprises a line-shaped pattern extending continuously along the first and second sides.

7. The photomask of claim 5, wherein the dummy photomask pattern comprises a first line-shaped pattern extending along the first side and a second line-shaped pattern extending along the second side, wherein the first and second line-shaped patterns are spaced apart from each other.

* * * * *